(12) United States Patent
Choi et al.

(10) Patent No.: US 12,119,331 B2
(45) Date of Patent: Oct. 15, 2024

(54) SEMICONDUCTOR PACKAGE

(71) Applicant: Samsung Electronics Co., Ltd., Suwon-si (KR)

(72) Inventors: Ju-Il Choi, Seongnam-si (KR); Gyuho Kang, Cheonan-si (KR); Heewon Kim, Anyang-si (KR); Sechul Park, Bucheon-si (KR); Jongho Park, Cheonan-si (KR); Junyoung Park, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 207 days.

(21) Appl. No.: 17/677,453

(22) Filed: Feb. 22, 2022

(65) Prior Publication Data
US 2022/0399316 A1    Dec. 15, 2022

(30) Foreign Application Priority Data
Jun. 14, 2021    (KR) .......................... 10-2021-0076873

(51) Int. Cl.
*H01L 23/498* (2006.01)
*H01L 23/00* (2006.01)
(Continued)

(52) U.S. Cl.
CPC .......... *H01L 25/105* (2013.01); *H01L 23/481* (2013.01); *H01L 23/49816* (2013.01);
(Continued)

(58) Field of Classification Search
CPC . H01L 25/105; H01L 25/5386; H01L 23/481; H01L 23/49816; H01L 23/49822;
(Continued)

(56) References Cited

U.S. PATENT DOCUMENTS 7,354,798 B2    4/2008    Pogge et al.
7,812,446 B2    10/2010    Kurita
(Continued)

FOREIGN PATENT DOCUMENTS

WO    WO-2017/111775 A1    6/2017
WO    WO-2019/089935 A1    5/2019

*Primary Examiner* — Nathan W Ha
(74) *Attorney, Agent, or Firm* — HARNESS, DICKEY & PIERCE, P.L.C.

(57) ABSTRACT

Disclosed is a semiconductor package comprising an interposer substrate having first and second surfaces opposite each other and including a wiring layer adjacent to the first surface, a semiconductor chip on the first surface of the interposer substrate, a passivation layer on the first surface of the interposer substrate and covering the semiconductor chip, and redistribution patterns in the passivation layer and connected to the semiconductor chip. The semiconductor chip has third and fourth surfaces opposite to each other. The third surface of the semiconductor chip faces the first surface of the interposer substrate. The redistribution patterns are connected to the fourth surface of the semiconductor chip. The semiconductor chip includes chip pads adjacent to the third surface and chip through electrodes connected to the chip pads. Each of the chip pads is directly bonded to a corresponding one of wiring patterns in the wiring layer.

18 Claims, 8 Drawing Sheets

(51) Int. Cl.
  *H01L 23/48* (2006.01)
  *H01L 23/538* (2006.01)
  *H01L 25/10* (2006.01)
  *H01L 25/065* (2023.01)

(52) U.S. Cl.
  CPC .. *H01L 23/49822* (2013.01); *H01L 23/49838* (2013.01); *H01L 23/5383* (2013.01); *H01L 23/5386* (2013.01); *H01L 24/08* (2013.01); *H01L 24/32* (2013.01); *H01L 23/49833* (2013.01); *H01L 24/80* (2013.01); *H01L 25/0657* (2013.01); *H01L 2224/08237* (2013.01); *H01L 2224/32225* (2013.01); *H01L 2224/80895* (2013.01); *H01L 2225/06513* (2013.01); *H01L 2225/06541* (2013.01); *H01L 2225/1023* (2013.01); *H01L 2225/1058* (2013.01); *H01L 2225/1094* (2013.01); *H01L 2924/1431* (2013.01); *H01L 2924/1434* (2013.01)

(58) Field of Classification Search
  CPC ........... H01L 23/49838; H01L 23/5383; H01L 23/5386; H01L 24/08; H01L 24/32
  See application file for complete search history.

(56) References Cited

U.S. PATENT DOCUMENTS

| | | | |
|---|---|---|---|
| 9,935,052 | B1 | 4/2018 | Liu et al. |
| 9,991,190 | B2 | 6/2018 | Huang et al. |
| 10,381,298 | B2 | 8/2019 | Yu et al. |
| 10,607,977 | B2 | 3/2020 | Shiu |
| 11,315,881 | B1* | 4/2022 | Ho ............ H01L 21/4853 |
| 2015/0262909 | A1* | 9/2015 | Chen ............ H01L 24/82 438/126 |
| 2015/0270232 | A1* | 9/2015 | Chen ............ H01L 25/10 257/691 |
| 2019/0378825 | A1* | 12/2019 | Shim ............ H01L 24/24 |
| 2020/0373216 | A1* | 11/2020 | Yoo ............ H01L 24/05 |
| 2021/0084762 | A1* | 3/2021 | Akejima ............ H01L 24/19 |
| 2021/0104492 | A1* | 4/2021 | Wu ............ H01L 24/09 |
| 2021/0225749 | A1 | 7/2021 | Vaisband et al. |
| 2021/0366877 | A1* | 11/2021 | Wu ............ H01L 23/5384 |
| 2022/0028816 | A1* | 1/2022 | Patil ............ H01L 24/20 |
| 2022/0084993 | A1* | 3/2022 | Kim ............ H01L 25/105 |
| 2022/0278058 | A1* | 9/2022 | Kuo ............ H01L 24/92 |
| 2022/0375838 | A1* | 11/2022 | We ............ H01L 24/19 |
| 2022/0384308 | A1* | 12/2022 | Lee ............ H01L 23/49833 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0076873, filed on Jun. 14, 2021 in the Korean Intellectual Property Office, the disclosure of which is hereby incorporated by reference in its entirety.

BACKGROUND

Inventive concepts relate to a semiconductor package, and more particularly, to a semiconductor package on which a plurality of semiconductor chips are mounted.

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board. With development in the electronic industry, there may be a demand for smaller, lighter, and multifunctional electronic devices. There are suggestions for a multi-chip package, in which a plurality of chips are stacked in a single semiconductor package, or a system-in-package, which has different kinds of chips mounted in a single semiconductor package and which operates as one system.

SUMMARY

Some embodiments of inventive concepts provide a semiconductor package in which mutual connection is easily established between a plurality of semiconductor chips.

Some embodiments of inventive concepts provide a semiconductor package with improved thermal radiation properties.

According to some embodiments of inventive concepts, a semiconductor package may include: an interposer substrate having a first surface and a second surface that are opposite to each other, the interposer substrate including a wiring layer adjacent to the first surface; a semiconductor chip on the first surface of the interposer substrate; a passivation layer on the first surface of the interposer substrate, the passivation layer covering the semiconductor chip; and a plurality of redistribution patterns in the passivation layer and connected to the semiconductor chip. The semiconductor chip may have a third surface and a fourth surface that are opposite to each other. The third surface of the semiconductor chip may face the first surface of the interposer substrate. The plurality of redistribution patterns may be connected to the fourth surface of the semiconductor chip. The semiconductor chip may include a plurality of chip pads adjacent to the third surface and a plurality of chip through electrodes connected to the plurality of chip pads. Each of the plurality of chip pads may be directly bonded to a corresponding one of a plurality of wiring patterns in the wiring layer.

According to some embodiments of inventive concepts, a semiconductor package may include: an interposer substrate having a first surface and a second surface that are opposite to each other, the interposer substrate including a wiring layer adjacent to the first surface; a first semiconductor chip and a second semiconductor chip that are horizontally spaced apart from each other on the first surface of the interposer substrate; a passivation layer on the first surface of the interposer substrate, the passivation layer covering the first semiconductor chip and the second semiconductor chip; and a plurality of redistribution patterns in the passivation layer. The plurality of redistribution patterns may connect the first semiconductor chip to the second semiconductor chip. The first semiconductor chip may have a third surface and a fourth surface that are opposite to each other. The first semiconductor chip may include a plurality of first chip pads adjacent to the third surface. The second semiconductor chip may have a fifth surface and a sixth surface that are opposite to each other. The second semiconductor chip may include a plurality of second chip pads adjacent to the fifth surface. Each of the plurality of first chip pads and the plurality of second chip pads may be directly bonded to a corresponding one of a plurality of wiring patterns in the wiring layer. The plurality of redistribution patterns may be connected to the fourth surface of the first semiconductor chip and to the sixth surface of the second semiconductor chip.

DETAILED DESCRIPTION OF EMBODIMENTS

The following will now describe in detail some embodiments of inventive concepts with reference to the accompanying drawings.

Figure 1:
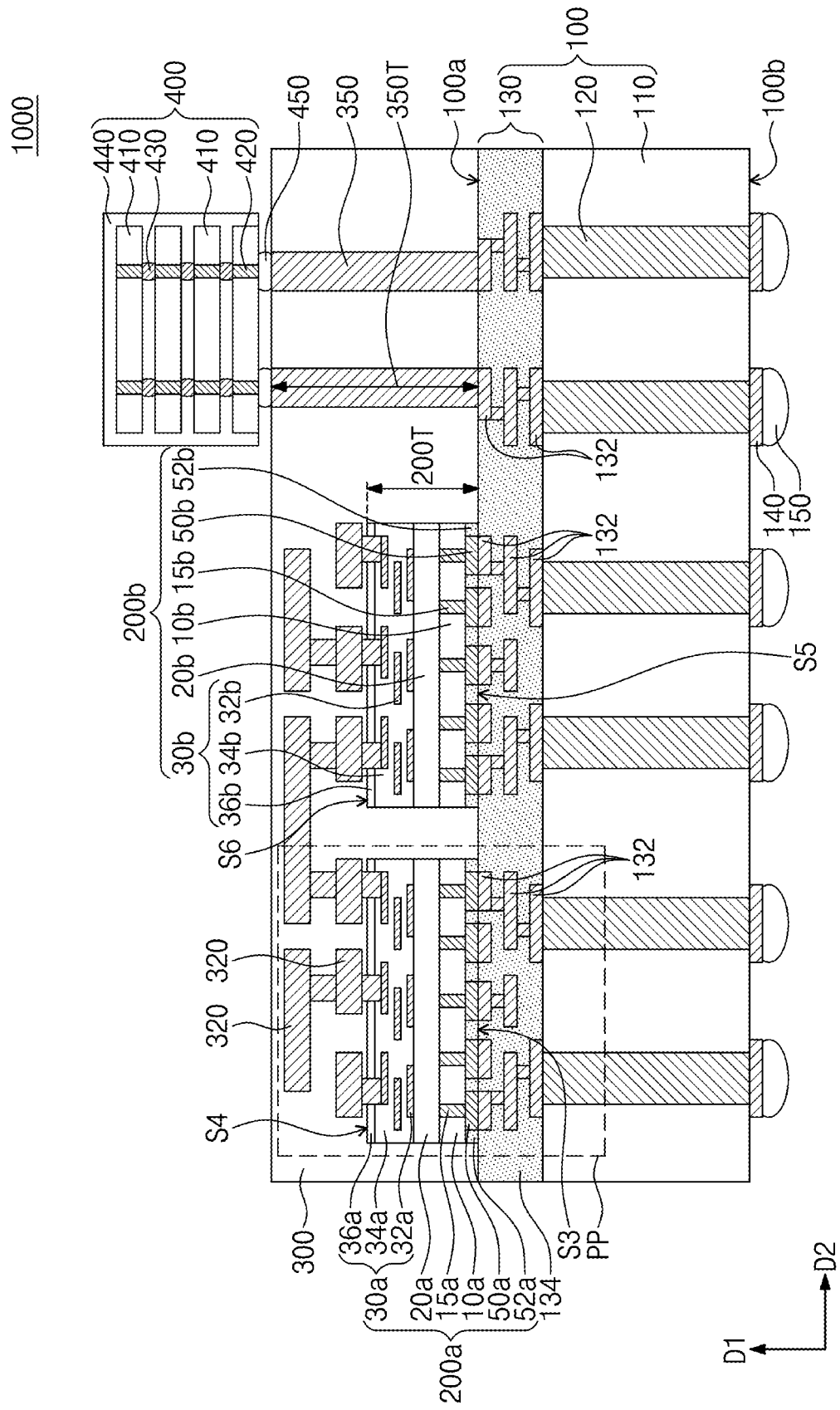
FIG. 1 illustrates a cross-sectional view showing a semiconductor package according to some embodiments of inventive concepts.
Figure 2:
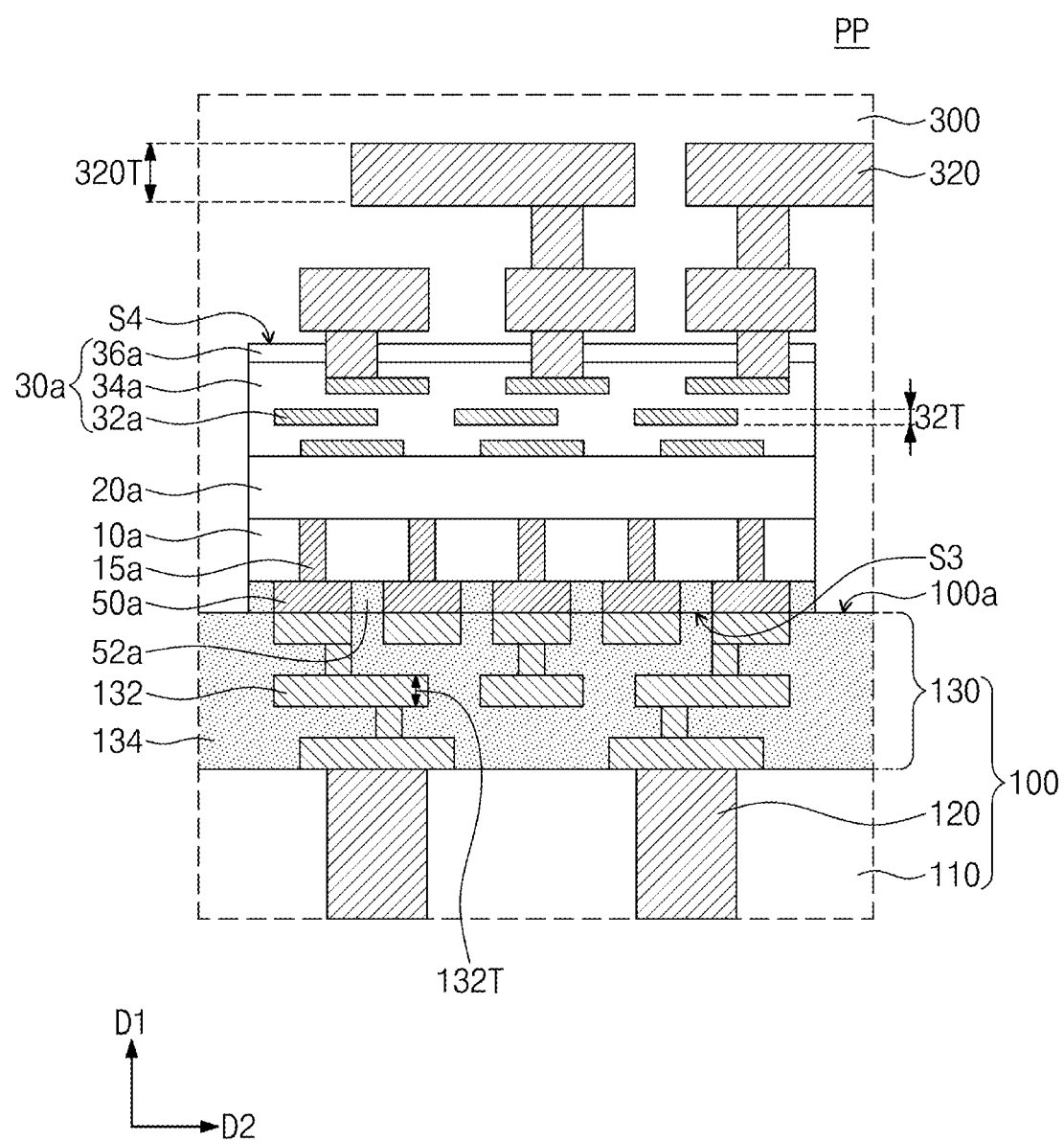
FIG. 2 illustrates an enlarged view showing section PP of FIG. 1.

FIG. 1 illustrates a cross-sectional view showing a semiconductor package according to some embodiments of inventive concepts. FIG. 2 illustrates an enlarged view showing section PP of FIG. 1.

Referring to FIGS. 1 and 2, a semiconductor package 1000 may include an interposer substrate 100 and a plurality of semiconductor chips 200a, 200b, and 400 mounted on the interposer substrate 100.

The interposer substrate 100 may include a base substrate 110, a plurality of through electrodes 120 that penetrate the base substrate 110, and a wiring layer 130 on the base substrate 110. The base substrate 110 may be, for example, a silicon substrate. The plurality of through electrodes 120 may be horizontally spaced apart from each other in the base substrate 110, and each of the plurality of through electrodes 120 may penetrate the base substrate 110. The plurality of through electrodes 120 may include metal, such as copper (Cu).

The wiring layer 130 may include wiring patterns 132 on the base substrate 110 and a wiring dielectric layer 134 that covers the wiring patterns 132. The wiring patterns 132 may include metal (e.g., copper), and the wiring dielectric layer 134 may include a dielectric material (e.g., silicon oxide, silicon nitride, and/or silicon oxynitride). The plurality of through electrodes 120 may be connected to the wiring layer 130. The plurality of through electrodes 120 may be connected to lowermost ones of the wiring patterns 132. Each of the plurality of through electrodes 120 may be connected to a corresponding one of the lowermost wiring patterns 132.

The interposer substrate 100 may have a first surface 100a and a second surface 100b that are opposite to each other, and the wiring layer 130 may be adjacent to the first surface 100a. The second surface 100b of the interposer substrate 100 may correspond to one surface of the base substrate 110. Each of the plurality of through electrodes 120 may extend from the wiring layer 130 toward the second surface 100b.

The interposer substrate 100 may be provided with conductive pads 140 on the second surface 100b thereof. The conductive pads 140 may be horizontally spaced apart from each other, and each of the plurality of through electrodes 120 may be connected to a corresponding one of the conductive pads 140. The conductive pads 140 may include a conductive material (e.g., metal).

The interposer substrate 100 may be provided on its second surface 100b with connection bumps 150 that are correspondingly connected to the conductive pads 140. The connection bumps 150 may be correspondingly disposed on the conductive pads 140. The connection bumps 150 may include a conductive material and may have at least one selected from solder-ball shapes, bump shapes, and pillar shapes.

The plurality of semiconductor chips 200a, 200b, and 400 may be mounted on the first surface 100a of the interposer substrate 100. The plurality of semiconductor chips 200a, 200b, and 400 may include a first semiconductor chip 200a and a second semiconductor chip 200b that are horizontally spaced apart from each other. According to some embodiments, the first semiconductor chip 200a and the second semiconductor chip 200b may be the same as each other. For example, the first semiconductor chip 200a and the second semiconductor chip 200b may be memory chips, logic chips, application processor (AP) chips, or system-on-chips (SOC). According to some embodiments, the first semiconductor chip 200a and the second semiconductor chip 200b may be different from each other. For example, the first and second semiconductor chips 200a and 200b may be different chips from each other, among memory chip, logic chip, application processor (AP) chip, or system-on-chip (SOC).

The first semiconductor chip 200a may have a third surface S3 and a fourth surface S4 that are opposite to each other, and the third surface S3 of the first semiconductor chip 200a may face the first surface 100a of the interposer substrate 100. The third surface S3 of the first semiconductor chip 200a may be in direct contact with the first surface 100a of the interposer substrate 100.

The first semiconductor chip 200a may include a first semiconductor substrate 10a, a first circuit layer 20a on the first semiconductor substrate 10a, a first chip wiring layer 30a on the first circuit layer 20a, a plurality of first chip through electrodes 15a that penetrate the first semiconductor substrate 10a, a plurality of first chip pads 50a connected to the plurality of first chip through electrodes 15a, and a first pad dielectric layer 52a that covers the first chip pads 50a.

The first chip pads 50a and the first pad dielectric layer 52a may be disposed adjacent to the third surface S3 of the first semiconductor chip 200a. The first chip pads 50a may be horizontally spaced apart from each other, and the first pad dielectric layer 52a may be interposed between the first chip pads 50a. The first pad dielectric layer 52a may expose bottom surfaces of the first chip pads 50a. The first chip pads 50a may include metal (e.g., copper), and the first pad dielectric layer 52a may include a dielectric material (e.g., silicon oxide, silicon nitride, and/or silicon oxynitride). The first chip pads 50a may be connected to uppermost ones of the wiring patterns 132 in the wiring layer 130 of the interposer substrate 100. Each of the first chip pads 50a may be directly bonded to a corresponding one of the uppermost wiring patterns 132. Each of the first chip pads 50a and its corresponding wiring pattern 132 may constitute, for example, a copper-to-copper (Cu—Cu) bonding. As each of the first chip pads 50a is directly bonded to its corresponding wiring pattern 132, the first pad dielectric layer 52a may be in direct contact with the wiring dielectric layer 134 in the wiring layer 130 of the interposer substrate 100.

The first semiconductor substrate 10a may be disposed on the first chip pads 50a and the first pad dielectric layer 52a. The first semiconductor substrate 10a may be, for example, a silicon substrate, a germanium substrate, or a silicon-germanium substrate. The plurality of first chip through electrodes 15a may be horizontally spaced apart from each other in the first semiconductor substrate 10a and may be connected to the first chip pads 50a. Each of the plurality of first chip through electrodes 15a may penetrate the first semiconductor substrate 10a and may connect with a corresponding one of the first chip pads 50a. The plurality of first chip through electrodes 15a may include metal (e.g., copper, tungsten, titanium, tantalum, etc.).

The first circuit layer 20a may be disposed on the first semiconductor substrate 10a and may include first integrated circuits. The first integrated circuits may include first transistors formed on the first semiconductor substrate 10a. The first transistors may be, for example, field effect transistors. The plurality of first chip through electrodes 15a may be connected to the first circuit layer 20a. Each of the plurality of first chip through electrodes 15a may be electrically connected to a terminal of a corresponding one of the first transistors.

The first chip wiring layer 30a may be disposed adjacent to the fourth surface S4 of the first semiconductor chip 200a. The first circuit layer 20a may be disposed between the first chip wiring layer 30a and the first semiconductor substrate 10a and between the first chip wiring layer 30a and the plurality of first chip through electrodes 15a. The first semiconductor substrate 10a may be disposed between the first circuit layer 20a and the first chip pads 50a and between the first circuit layer 20a and the first pad dielectric layer 52a. The plurality of first chip through electrodes 15a may be disposed between and electrically connected to the first circuit layer 20a and the first chip pads 50a.

The first chip wiring layer 30a may include first chip wiring patterns 32a on the first circuit layer 20a, a first chip wiring dielectric layer 34a that covers the first chip wiring patterns 32a, and a first protection layer 36a on the first chip wiring dielectric layer 34a. The first chip wiring patterns 32a may be connected to the first circuit layer 20a. The first chip wiring patterns 32a may be electrically connected to the first transistors in the first circuit layer 20a. The first chip wiring patterns 32a may include one or more of metal (e.g., copper, tungsten, titanium, tantalum, etc.) and conductive metal nitride. For example, the first chip wiring dielectric layer 34a may include one or more of silicon oxide, silicon nitride, and silicon oxynitride, and the first protection layer 36a may include silicon oxide.

The second semiconductor chip 200b may have a fifth surface S5 and a sixth surface S6 that are opposite to each other, and the fifth surface S5 of the second semiconductor chip 200b may face the first surface 100a of the interposer substrate 100. The fifth surface S5 of the second semiconductor chip 200b may be in direct contact with the first surface 100a of the interposer substrate 100.

The second semiconductor chip 200b may include a second semiconductor substrate 10b, a second circuit layer 20b on the second semiconductor substrate 10b, a second chip wiring layer 30b on the second circuit layer 20b, a plurality of second chip through electrodes 15b that penetrate the second semiconductor substrate 10b, a plurality of second chip pads 50b connected to the plurality of second chip through electrodes 15b, and a second pad dielectric layer 52b that covers the second chip pads 50b.

The second chip pads 50b and the second pad dielectric layer 52b may be disposed adjacent to the fifth surface S5 of the second semiconductor chip 200b. The second chip pads 50b may be horizontally spaced apart from each other, and the second pad dielectric layer 52b may be interposed between the second chip pads 50b. The second pad dielectric layer 52b may expose bottom surfaces of the second chip pads 50b. The second chip pads 50b may include metal (e.g., copper), and the second pad dielectric layer 52b may include a dielectric material (e.g., silicon oxide, silicon nitride, and/or silicon oxynitride). The second chip pads 50b may be connected to uppermost ones of the wiring patterns 132 in the wiring layer 130 of the interposer substrate 100. Each of the second chip pads 50b may be directly bonded to a corresponding one of the uppermost wiring patterns 132. Each of the second chip pads 50b and its corresponding wiring pattern 132 may constitute, for example, a copper-to-copper (Cu—Cu) bonding. As each of the second chip pads 50b is directly bonded to its corresponding wiring pattern 132, the second pad dielectric layer 52b may be in direct contact with the wiring dielectric layer 134 in the wiring layer 130 of the interposer substrate 100.

The second semiconductor substrate 10b may be disposed on the second chip pads 50b and the second pad dielectric layer 52b. The second semiconductor substrate 10b may be, for example, a silicon substrate, a germanium substrate, or a silicon-germanium substrate. The plurality of second chip through electrodes 15b may be horizontally spaced apart from each other in the second semiconductor substrate 10b and may be connected to the second chip pads 50b. Each of the plurality of second chip through electrodes 15b may penetrate the second semiconductor substrate 10b and may connect with a corresponding one of the second chip pads 50b. The plurality of second chip through electrodes 15b may include metal (e.g., copper, tungsten, titanium, or tantalum).

The second circuit layer 20b may be disposed on the second semiconductor substrate 10b and may include second integrated circuits. The second integrated circuits may include second transistors formed on the second semiconductor substrate 10b. The second transistors may be, for example, field effect transistors. The plurality of second chip through electrodes 15b may be connected to the second circuit layer 20b. Each of the plurality of second chip through electrodes 15b may be electrically connected to a terminal of a corresponding one of the second transistors.

The second chip wiring layer 30b may be disposed adjacent to the sixth surface S6 of the second semiconductor chip 200b. The second circuit layer 20b may be disposed between the second chip wiring layer 30b and the second semiconductor substrate 10b and between the second chip wiring layer 30b and the plurality of second chip through electrodes 15b. The second semiconductor substrate 10b may be disposed between the second circuit layer 20b and the second chip pads 50b and between the second circuit layer 20b and the second pad dielectric layer 52b. The plurality of second chip through electrodes 15b may be disposed between and electrically connected to the second circuit layer 20b and the second chip pads 50b.

The second chip wiring layer 30b may include second chip wiring patterns 32b on the second circuit layer 20b, a second chip wiring dielectric layer 34b that covers the second chip wiring patterns 32b, and a second protection layer 36b on the second chip wiring dielectric layer 34b. The second chip wiring patterns 32b may be connected to the second circuit layer 20b. The second chip wiring patterns 32b may be electrically connected to the second transistor in the second circuit layer 20b. The second chip wiring patterns 32b may include one or more of metal (e.g., copper, tungsten, titanium, tantalum, etc.) and conductive metal nitride. For example, the second chip wiring dielectric layer 34b may include one or more of silicon oxide, silicon nitride, and silicon oxynitride, and the second protection layer 36b may include silicon oxide.

The interposer substrate 100 may be provided on its first surface with a passivation layer 300 that covers the first and second semiconductor chips 200a and 200b. The passivation layer 300 may include at least one selected from polyimide (PI), benzocyclobutene (BCB), polybenzoxazole (PBO), bismaleimide triazine (BT), phenolic resins, epoxy, silicon oxide, and silicon nitride.

Redistribution patterns 320 may be disposed in the passivation layer 300 and on (or above) the first and second semiconductor chips 200a and 200b. The redistribution patterns 320 may electrically connect the first and second semiconductor chips 200a and 200b to each other. One or more of the redistribution patterns 320 may be connected to the fourth surface S4 of the first semiconductor chip 200a, and another or more of the redistribution patterns 320 may be connected to the sixth surface S6 of the second semiconductor chip 200b. The one or more of the redistribution patterns 320 may be connected to corresponding one or more of the first chip wiring patterns 32a in the first chip wiring layer 30a of the first semiconductor chip 200a, and the another or more of the redistribution patterns 320 may be connected to corresponding one or more of the second chip wiring patterns 32b in the second chip wiring layer 30b of the second semiconductor chip 200b. The redistribution patterns 320 may include metal, such as copper, aluminum, titanium, or tungsten. The passivation layer 300 may cover the redistribution patterns 320, and may cover top surfaces of uppermost ones of the redistribution patterns 320.

Each of the first chip wiring patterns 32a in the first chip wiring layer 30a, each of the second chip wiring patterns 32b in the second chip wiring layer 30b and each of the redistribution patterns 320 may have a thickness in a first direction D1 perpendicular to the first surface 100a of the interposer substrate 100. Each of the redistribution patterns 320 may have a thickness 320T greater than a thickness 32T of each of the first and second chip wiring patterns 32a and 32b. Each of the wiring patterns 132 in the wiring layer 130 of the interposer substrate 100 may have a thickness 132T in the first direction D1, and the thickness 320T of each of the redistribution patterns 320 may be greater than the thickness 132T of each of the wiring patterns 132. The thickness 320T of each of the redistribution patterns 320 may range from about 1 µm to about 2 µm. For example, a value of about 100 Å to about 10,000 Å may be given as the thickness 132T of each of the wiring patterns 132 in the wiring layer 130 of the interposer substrate 100, and a value of about 100 Å to about 10,000 Å may be given as the thickness 32T of each of the first and second chip wiring patterns 32a and 32b.

In the base substrate 110, the plurality of through electrodes 120 of the interposer substrate 100 may be horizontally spaced apart from each other along a second direction D2 parallel to the first surface 100a of the interposer substrate 100. Each of the plurality of through electrodes 120 may extend along the first direction D1 to penetrate the base substrate 110. The first chip through electrodes 15a of the first semiconductor chip 200a may be horizontally spaced apart from each other along the second direction D2 in the first semiconductor substrate 10a, and each of the first chip through electrodes 15a may extend along the first direction D1 to penetrate the first semiconductor substrate 10a. The second chip through electrodes 15b of the second semiconductor chip 200b may be horizontally spaced apart from each other along the second direction D2 in the second semiconductor substrate 10b, and each of the second chip through electrodes 15b may extend along the first direction D1 to penetrate the second semiconductor substrate 10b. Each of the plurality of through electrodes 120 in the interposer substrate 100 may have a size (e.g., a length in the first direction D1 and/or a width in the second direction D2) greater than a size (e.g., a length in the first direction D1 and/or a width in the second direction D2) of each of the first and second chip through electrodes 15a and 15b.

The passivation layer 300 may be provided therein with conductive pillars 350 that are horizontally spaced apart from the first and second semiconductor chips 200a and 200b. The first and second semiconductor chips 200a and 200b may be spaced apart from each other in the second direction D2, and the conductive pillars 350 may be spaced apart along the second direction D2 from the first and second semiconductor chips 200a and 200b. The conductive pillars 350 may be connected to the first surface 100a of the interposer substrate 100. The conductive pillars 350 may be connected to uppermost ones of the wiring patterns 132 in the wiring layer 130 of the interposer substrate 100. Each of the conductive pillars 350 may penetrate the passivation layer 300 and may connect with a corresponding one of the uppermost wiring patterns 132. The conductive pillars 350 may include metal (e.g., copper).

The conductive pillars 350 and the first and second semiconductor chips 200a and 200a may each have a thickness in the first direction D1. Each of the conductive pillars 350 may have a thickness 350T greater than a thickness 200T of each of the first and second semiconductor chips 200a and 200b. The thickness 200T of each of the first and second semiconductor chips 200a and 200b may range, for example, from about 15 µm to about 800 µm, and the thickness 350T of each of the conductive pillars 350 may range, for example, from about 15 µm to about 800 µm.

The plurality of semiconductor chips 200a, 200b, and 400 may further include a third semiconductor chip 400 on the passivation layer 300. The third semiconductor chip 400 may be the same as or different from the first and second semiconductor chips 200a and 200b.

According to some embodiments, the third semiconductor chip 400 may include a plurality of sub-semiconductor chips 410 that are vertically stacked in the first direction D1, a plurality of sub-through electrodes 420 that penetrate the plurality of sub-semiconductor chips 410, a plurality of sub-bumps 430 between the plurality of sub-semiconductor chips 410, and a mold layer 440 that covers the plurality of sub-semiconductor chips 410. The plurality of sub-semiconductor chips 410 may include a plurality of memory chips. For example, a lowermost one of the plurality of sub-semiconductor chips 410 may include a logic circuit, a memory circuit, or a combination thereof, and remaining ones of the plurality of sub-semiconductor chips 410 may be the same memory chip. The sub-bumps 430 may be disposed between neighboring ones of the plurality of sub-semiconductor chips 410 and may be connected to the sub-through electrodes 420 of the neighboring sub-semiconductor chips 410. The plurality of sub-semiconductor chips 410 may be electrically connected to each other through the sub-bumps 430 and the sub-through electrodes 420. The third semiconductor chip 400 may be, for example, a high bandwidth memory (HBM) chip. In some embodiments, the third semiconductor chip 400 may be a HBM chip that complies with a High Bandwidth Memory (HBM) standard released by JEDEC (Joint Electron Device Engineering Council), as well as future evolutions/versions of HBM standards. The mold layer 440 may cover the plurality of sub-semiconductor chips 410 and may extend between the plurality of sub-semiconductor chips 410 to thereby cover the sub-bumps 430. The sub-bumps 430 and the sub-through electrodes 420 may include a conductive material, and the mold layer 440 may include a dielectric material.

A plurality of bumps 450 may be disposed between the third semiconductor chip 400 and the conductive pillars 350. The bumps 450 may be connected to the lowermost one of the sub-semiconductor chips 410 included in the third semiconductor chip 400. Each of the bumps 450 may be connected to a corresponding one of the sub-through electrodes 420 that penetrate the lowermost sub-semiconductor chip 410. The bumps 450 may be disposed on and connected to corresponding conductive pillars 350. The bumps 450 may include a conductive material and may have at least one selected from solder-ball shapes, bump shapes, and pillar shapes.

The first semiconductor chip 200a may be electrically connected through the first chip pads 50a to corresponding ones of the wiring patterns 132 in the wiring layer 130 of the interposer substrate 100. The corresponding wiring patterns 132 connected to the first semiconductor chip 200a may constitute, for example, a power delivery network (PDN) that provides the first semiconductor chip 200a with power or ground. The second semiconductor chip 200b may be electrically connected through the second chip pads 50b to corresponding ones of the wiring patterns 132 in the wiring layer 130 of the interposer substrate 100. The corresponding wiring patterns 132 connected to the second semiconductor chip 200b may constitute, for example, a power delivery network (PDN) that provides the second semiconductor chip 200b with power or ground.

The third semiconductor chip 400 may be connected to the first surface 100a of the interposer substrate 100 through the bumps 450 and the conductive pillars 350. The third semiconductor chip 400 may be electrically connected through the bumps 450 and the conductive pillars 350 to corresponding ones of the wiring patterns 132 in the wiring layer 130 of the interposer substrate 100.

According to inventive concepts, one or more of the wiring patterns 132 in the wiring layer 130 of the interposer substrate 100 may constitute a power delivery network (PDN) that provides the first and second semiconductor chips 200a and 200b with power or ground. The first and second chip pads 50a and 50b of the first and second semiconductor chips 200a and 200b may be directly bonded to corresponding ones of the wiring patterns 132, and the first and second semiconductor chips 200a and 200b may be electrically connected to each other through the redistribution patterns 320 on the first and second semiconductor chips 200a and 200b. As the first and second chip pads 50a and 50b are directly bonded to the corresponding wiring patterns 132, heat generated from the first and second semiconductor chips 200a and 200b may be easily discharged through the interposer substrate 100 (e.g., the base substrate 110). In addition, as the first and second semiconductor chips 200a and 200b are electrically connected to each other through the redistribution patterns 320 on the first and second semiconductor chips 200a and 200b, the first and second semiconductor chips 200a and 200b may easily achieve their mutual connection.

Accordingly, it may be possible to provide a semiconductor package in which mutual connection is easily established between a plurality of semiconductor chips and which exhibits improved thermal radiation properties.

FIGS. 3 to 10 illustrate cross-sectional views showing a method of fabricating a semiconductor package according to some embodiments of inventive concepts. For the sake of brevity, duplicate descriptions of previously discussed features/elements in FIGS. 1 and 2 may be briefly given or omitted.

Figure 3:
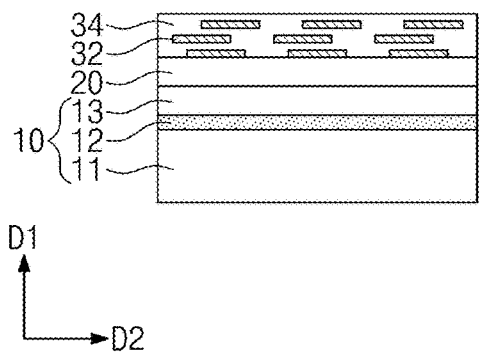
FIGS. 3 to 10 illustrate cross-sectional views showing a method of fabricating a semiconductor package according to some embodiments of inventive concepts.

Referring to FIG. 3, a semiconductor substrate 10 may be provided. The semiconductor substrate 10 may include a first semiconductor layer 11, a second semiconductor layer 12, and a third semiconductor layer 13 that are sequentially stacked. For example, the first and third semiconductor layers 11 and 13 may each be a silicon layer, and the second semiconductor layer 12 may be a silicon-germanium (SiGe) layer. A circuit layer 20 may be formed on the semiconductor substrate 10. The circuit layer 20 may include integrated circuits, and the integrated circuits may include transistors formed on the semiconductor substrate 10 (e.g., the third semiconductor layer 13). The circuit layer 20 may be provided thereon with chip wiring patterns 32 that are formed to connect with the circuit layer 20. The chip wiring patterns 32 may be electrically connected to the transistors formed in the circuit layer 20. A chip wiring dielectric layer 34 may be formed on the circuit layer 20, covering the chip wiring patterns 32.

Figure 4:
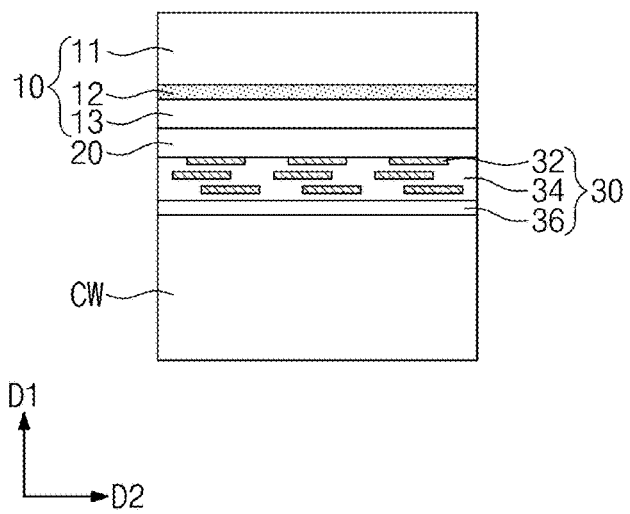

Referring to FIG. 4, a protection layer 36 may be formed on a carrier substrate CW. The carrier substrate CW may be a semiconductor substrate (e.g., silicon substrate), and the protection layer 36 may include silicon oxide. The semiconductor substrate 10, on which the circuit layer 20, the chip wiring patterns 32, and the chip wiring dielectric layer 34 are formed, may be turned upside down such that the semiconductor substrate 10 may be provided on the carrier substrate CW, and that the chip wiring dielectric layer 34 may be disposed adjacent to the protection layer 36. The carrier substrate CW and the semiconductor substrate 10 may be bonded in a wafer-to-wafer bonding method. For example, the chip wiring dielectric layer 34 and the protection layer 36 may be directly bonded to each other.

A chip wiring layer 30 may be provided by the chip wiring patterns 32, the chip wiring dielectric layer 34, and the protection layer 36. The chip wiring layer 30 may be disposed between the carrier substrate CW and the semiconductor substrate 10, and the circuit layer 20 may be disposed between the chip wiring layer 30 and the semiconductor substrate 10.

Figure 5:
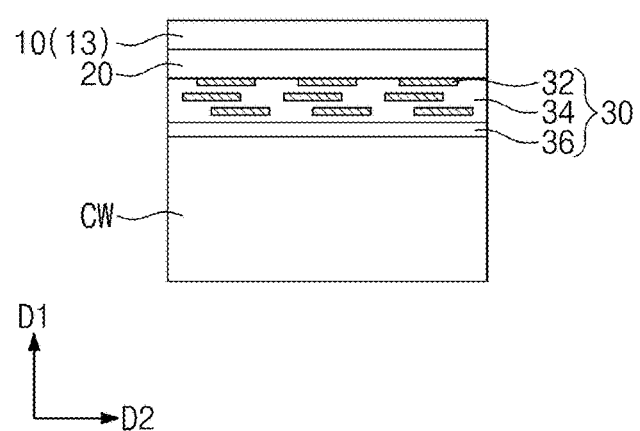

Referring to FIG. 5, an upper portion of the semiconductor substrate 10 may be removed. The removal of the upper portion from the semiconductor substrate 10 may include, for example, performing a wet etching process to etch the first semiconductor layer 11 of the semiconductor substrate 10, and performing a dry or wet etching process to etch the second semiconductor layer 12 of the semiconductor substrate 10. The second semiconductor layer 12 may serve as an etch stop layer during the etching of the first semiconductor layer 11. The etching of the second semiconductor layer 12 may expose the third semiconductor layer 13 of the semiconductor substrate 10. After the etching of the second semiconductor layer 12, the third semiconductor layer 13 may remain on the circuit layer 20. In this description below, the third semiconductor layer 13 may be called the semiconductor substrate 10.

Figure 6:
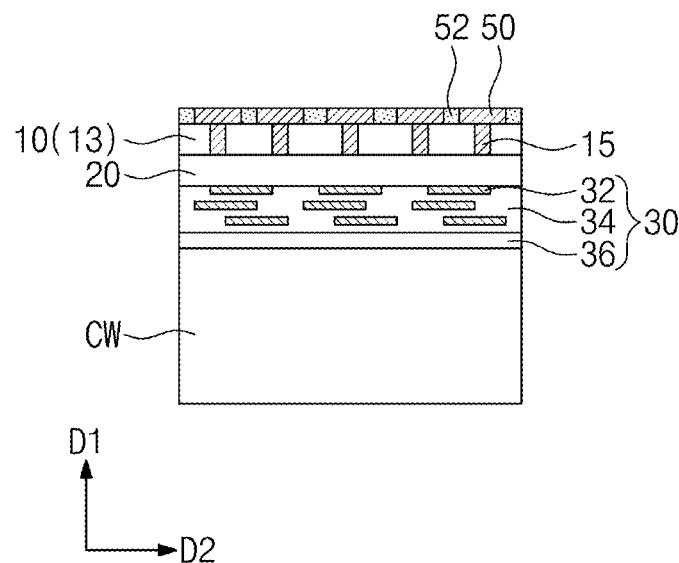

Referring to FIG. 6, a plurality of chip through electrodes 15 may be formed in the semiconductor substrate 10 (or the third semiconductor layer 13). The formation of the plurality of chip through electrodes 15 may include, for example, forming a plurality of chip through holes that penetrate the semiconductor substrate 10 (or the third semiconductor layer 13), forming a conductive layer that fills the plurality of chip through holes, and then planarizing the conductive layer. The planarization may form the plurality of chip through electrodes 15 locally in corresponding chip through holes. The plurality of chip through electrodes 15 may be connected to the circuit layer 20. Each of the plurality of chip through electrodes 15 may penetrate the semiconductor substrate 10 (or the third semiconductor layer 13) and connect with a terminal of a corresponding one of the transistors formed in the circuit layer 20.

A plurality of chip pads 50 may be formed on the semiconductor substrate 10 (or the third semiconductor layer 13) and on the plurality of chip through electrodes 15. The formation of the chip pads 50 may include, for example, forming a pad conductive layer on the semiconductor substrate 10 (or the third semiconductor layer 13), and then patterning the pad conductive layer. The chip pads 50 may be formed horizontally spaced apart from each other. Each of the chip pads 50 may be electrically connected to a corresponding one of the plurality of chip through electrodes 15. A pad dielectric layer 52 may be formed on the semiconductor substrate 10 (or the third semiconductor layer 13) and between the chip pads 50. The pad dielectric layer 52 may expose surfaces of the chip pads 50.

Figure 7:
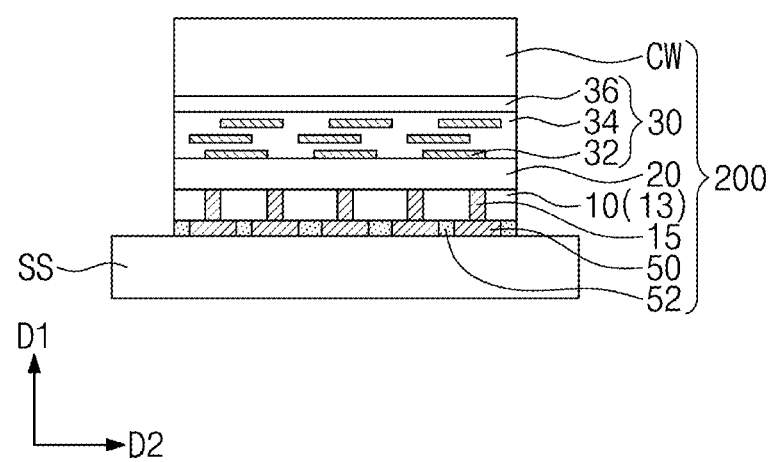

Referring to FIG. 7, the carrier substrate CW and the semiconductor substrate 10 (or the third semiconductor layer 13), which are bonded to each other, may be turned upside down such that the carrier substrate CW and the semiconductor substrate 10 may be provided on a support substrate SS, and that the chip pads 50 and the pad dielectric layer 52 may be disposed adjacent to the support substrate SS. The semiconductor substrate 10 (or the third semiconductor layer 13), on which the plurality of chip through electrodes 15 are formed, may be disposed adjacent to the chip pads 50 and the pad dielectric layer 52, and the circuit layer 20 may be disposed between the chip wiring layer 30 and the semiconductor substrate 10 (or the third semiconductor layer 13). The chip wiring layer 30 may be disposed between the circuit layer 20 and the carrier substrate CW.

The carrier substrate CW may undergo a grinding process to remove an upper portion of the carrier substrate CW. Afterwards, a sawing process may be executed on the support substrate SS, and thus a plurality of semiconductor chips 200 may be formed. Each of the plurality of semiconductor chips 200 may include the semiconductor substrate 10 (or the third semiconductor layer 13), the circuit layer 20 on one surface of the semiconductor substrate 10, the chip pads 50 and the pad dielectric layer 52 on other surface of the semiconductor substrate 10, the plurality of chip through electrodes 15 that penetrate the semiconductor substrate 10, the chip wiring layer 30 on the circuit layer 20, and a residual carrier substrate CW on the chip wiring layer 30.

Figure 8:
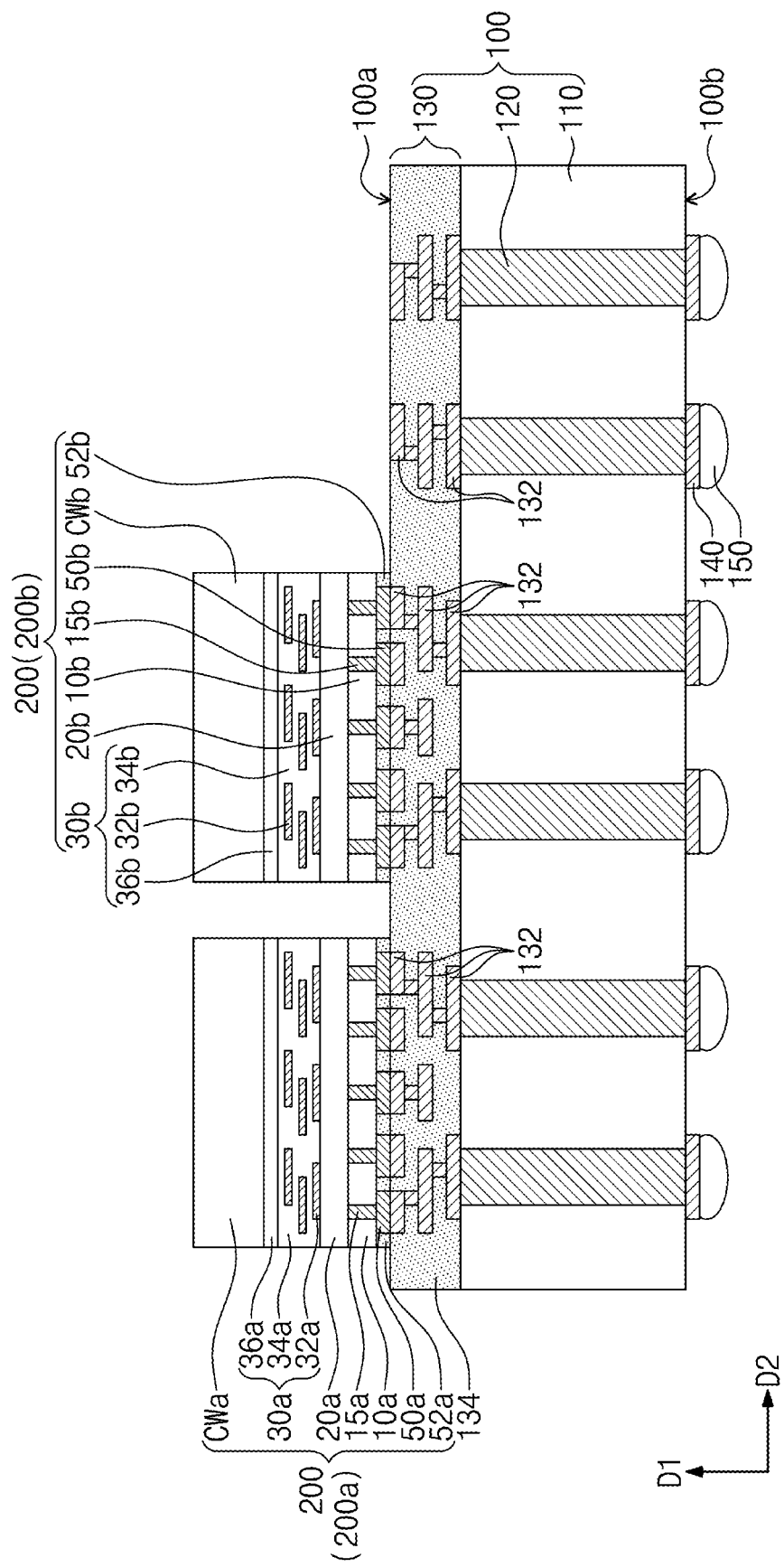

Referring to FIG. 8, an interposer substrate 100 may be provided. The interposer substrate 100 may include a base substrate 110, a plurality of through electrodes 120 that penetrate the base substrate 110, and a wiring layer 130 on the base substrate 110. The wiring layer 130 may include wiring patterns 132 on the base substrate 110 and a wiring dielectric layer 134 that covers the wiring patterns 132. The interposer substrate 100 may have a first surface 100a and a second surface 100b that are opposite to each other, and the wiring layer 130 may be adjacent to the first surface 100a. A plurality of conductive pads 140 may be disposed on the second surface 100b of the interposer substrate 100, and a plurality of connection bumps 150 may be disposed on the second surface 100b of the interposer substrate 100 and on corresponding conductive pads 140.

The plurality of semiconductor chips 200 may be mounted on the first surface 100a of the interposer substrate 100. The plurality of semiconductor chips 200 may include a first semiconductor chip 200a and a second semiconductor chip 200b. According to some embodiments, the first semiconductor chip 200a and the second semiconductor chip 200b may be the same as each other.

The first semiconductor chip 200a may include a first semiconductor substrate 10a, a first circuit layer 20a on one surface of the first semiconductor substrate 10a, first chip pads 50a and a first pad dielectric layer 52a on other surface of the first semiconductor substrate 10a, a plurality of first chip through electrodes 15a that penetrate the first semiconductor substrate 10a, a first chip wiring layer 30a on the first circuit layer 20a, and a residual first carrier substrate CWa on the first chip wiring layer 30a. The first chip wiring layer 30a may include first chip wiring patterns 32a on the first circuit layer 20a, a first chip wiring dielectric layer 34a that covers the first chip wiring patterns 32a, and a first protection layer 36a on the first chip wiring dielectric layer 34a.

The second semiconductor chip 200b may include a second semiconductor substrate 10b, a second circuit layer 20b on one surface of the second semiconductor substrate 10b, second chip pads 50b and a second pad dielectric layer 52b on other surface of the second semiconductor substrate 10b, a plurality of second chip through electrodes 15b that penetrate the second semiconductor substrate 10b, a second chip wiring layer 30b on the second circuit layer 20b, and a residual second carrier substrate CWb on the second chip wiring layer 30b. The second chip wiring layer 30b may include second chip wiring patterns 32b on the second circuit layer 20b, a second chip wiring dielectric layer 34b that covers the second chip wiring patterns 32b, and a second protection layer 36b on the second chip wiring dielectric layer 34b.

The first and second semiconductor substrates 10a and 10b, the first and second circuit layers 20a and 20b, the first and second chip pads 50a and 50b, the first and second pad dielectric layers 52a and 52b, the first and second chip through electrodes 15a and 15b, the first and second chip wiring layers 30a and 30b, and the residual first and second carrier substrates CWa and CWb may be respectively the same or substantially the same as the semiconductor substrate 10 (or the third semiconductor layer 13), the circuit layer 20, the chip pads 50, the pad dielectric layer 52, the chip through electrodes 15, the chip wiring layer 30, and the residual carrier substrate CW that are discussed with reference to FIGS. 3 to 7.

A die-to-wafer bonding method may be used to mount each of the first and second semiconductor chips 200a and 200b on the interposer substrate 100. For example, the first chip pads 50a of the first semiconductor chip 200a may be connected to uppermost ones of the wiring patterns 132 in the wiring layer 130 of the interposer substrate 100. Each of the first chip pads 50a may be directly bonded to a corresponding one of the uppermost wiring patterns 132. Each of the first chip pads 50a and its corresponding wiring pattern 132 may constitute, for example, a copper-to-copper (Cu—Cu) bonding. As each the first chip pads 50a is directly bonded to its corresponding wiring pattern 132, the first pad dielectric layer 52a may be in direct contact with the wiring dielectric layer 134 in the wiring layer 130 of the interposer substrate 100. The second chip pads 50b of the second semiconductor chip 200b may be connected to uppermost ones of the wiring patterns 132 in the wiring layer 130 of the interposer substrate 100. Each of the second chip pads 50b may be directly bonded to a corresponding one of the uppermost wiring patterns 132. Each of the second chip pads 50b and its corresponding wiring pattern 132 may constitute, for example, a copper-to-copper (Cu—Cu) bonding. As each of the second chip pads 50b is directly bonded to its corresponding wiring pattern 132, the second pad dielectric layer 52b may be in direct contact with the wiring dielectric layer 134 in the wiring layer 130 of the interposer substrate 100.

Figure 9:
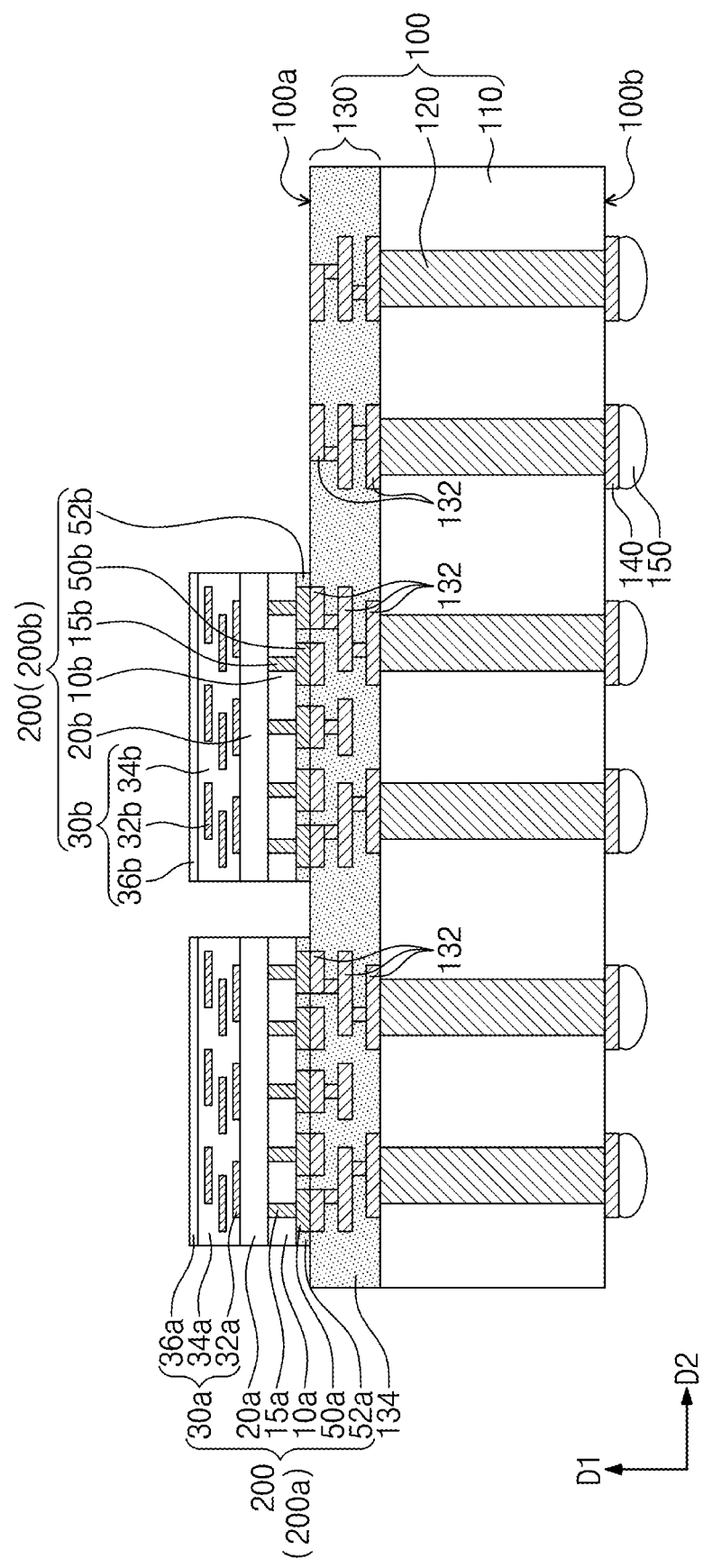

Referring to FIG. 9, an etching process may be performed on each of the first and second semiconductor chips 200a and 200b mounted on the interposer substrate 100. The etching process may remove the residual first and second carrier substrates CWa and CWb of the first and second semiconductor chips 200a and 200b. The etching process may be, for example, a dry etching process. The removal of the residual first and second carrier substrates CWa and CWb may expose the first and second protection layers 36a and 36b of the first and second semiconductor chips 200a and 200b.

Figure 10:
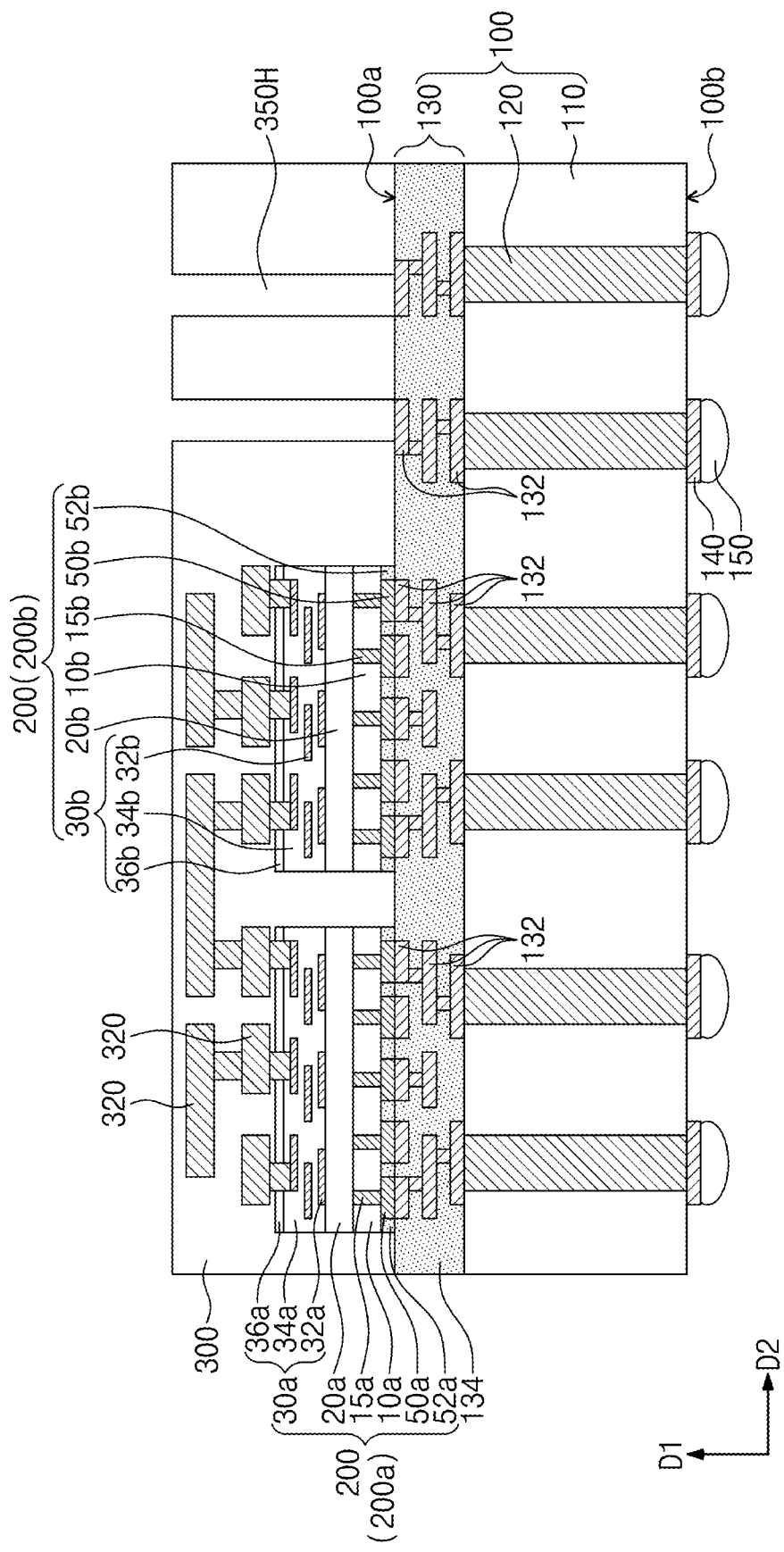

Referring to FIG. 10, a passivation layer 300 may be formed on the first surface 100a of the interposer substrate 100, thereby covering the first and second semiconductor chips 200a and 200b. A plurality of redistribution patterns 320 may be formed in the passivation layer 300 and on (or above) the first and second semiconductor chips 200a and 200b. The redistribution patterns 320 may electrically connect the first and second semiconductor chips 200a and 200b to each other. One or more of the redistribution patterns 320 may be connected to a corresponding one or more of the first chip wiring patterns 32a in the first chip wiring layer 30a of the first semiconductor chip 200a, and another or more of the redistribution patterns 320 may be connected to a corresponding one or more of the second chip wiring patterns 32b in the second chip wiring layer 30b of the second semiconductor chip 200b. The formation of the redistribution patterns 320 may include, for example, forming on the first surface 100a of the interposer substrate 100 a portion of the passivation layer 300 that covers the first and second semiconductor chips 200a and 200b, forming a redistribution conductive layer on the portion of the passivation layer 300, patterning the redistribution conductive layer to form the redistribution patterns 320, and forming on the redistribution patterns 320 a remaining portion of the passivation layer 300 that covers the redistribution patterns 320.

A plurality of vertical holes 350H may be formed in the passivation layer 300 and horizontally spaced apart from the first and second semiconductor chips 200a and 200b. The vertical holes 350H may expose uppermost ones of the wiring patterns 132 in the wiring layer 130 of the interposer substrate 100. Each of the vertical holes 350H may penetrate the passivation layer 300 and expose a corresponding one of the uppermost wiring patterns 132. The formation of the vertical holes 350H may include, for example, forming on the passivation layer 300 a mask pattern that defines regions where the vertical holes 350H will be formed, and using the mask pattern as an etching mask to etch the passivation layer 300.

Referring back to FIG. 1, a plurality of conductive pillars 350 may be correspondingly formed in the vertical holes 350H. The formation of the conductive pillars 350 may include, for example, forming on the passivation layer 300 a conductive layer that fills the vertical holes 350H, and planarizing the conductive layer until the passivation layer 300 is exposed. The planarization may form the conductive pillars 350 locally in corresponding vertical holes 350H. Each of the conductive pillars 35 may penetrate the passivation layer 300 and connect with a corresponding one of the uppermost wiring patterns 132 in the wiring layer 130 of the interposer substrate 100.

A third semiconductor chip 400 may be provided on the passivation layer 300. The third semiconductor chip 400 may include a plurality of sub-semiconductor chips 410 that are vertically stacked, a plurality of sub-through electrodes 420 that correspondingly penetrate the plurality of sub-semiconductor chips 410, a plurality of sub-bumps 430 between the plurality of sub-semiconductor chips 410, and a mold layer 440 that covers the plurality of sub-semiconductor chips 410. The plurality of sub-semiconductor chips 410 may be electrically connected to each other through the sub-bumps 430 and the sub-through electrodes 420. The third semiconductor chip 400 may be, for example, a high bandwidth memory (HBM) chip.

A plurality of bumps 450 may be formed on a bottom surface of the third semiconductor chip 400. The bumps 450 may be connected to a lowermost one of the sub-semiconductor chips 410 included in the third semiconductor chip 400. Each of the bumps 450 may be connected to a corresponding one of the sub-through electrodes 420 that penetrate the lowermost sub-semiconductor chip 410. The third semiconductor chip 400 may be provided on the passivation layer 300 so as to allow the bumps 450 to connect with corresponding conductive pillars 350. The third semiconductor chip 400 may be electrically connected through the bumps 450 and the conductive pillars 350 to corresponding ones of the wiring patterns 132 in the wiring layer 130 of the interposer substrate 100.

Figure 11:
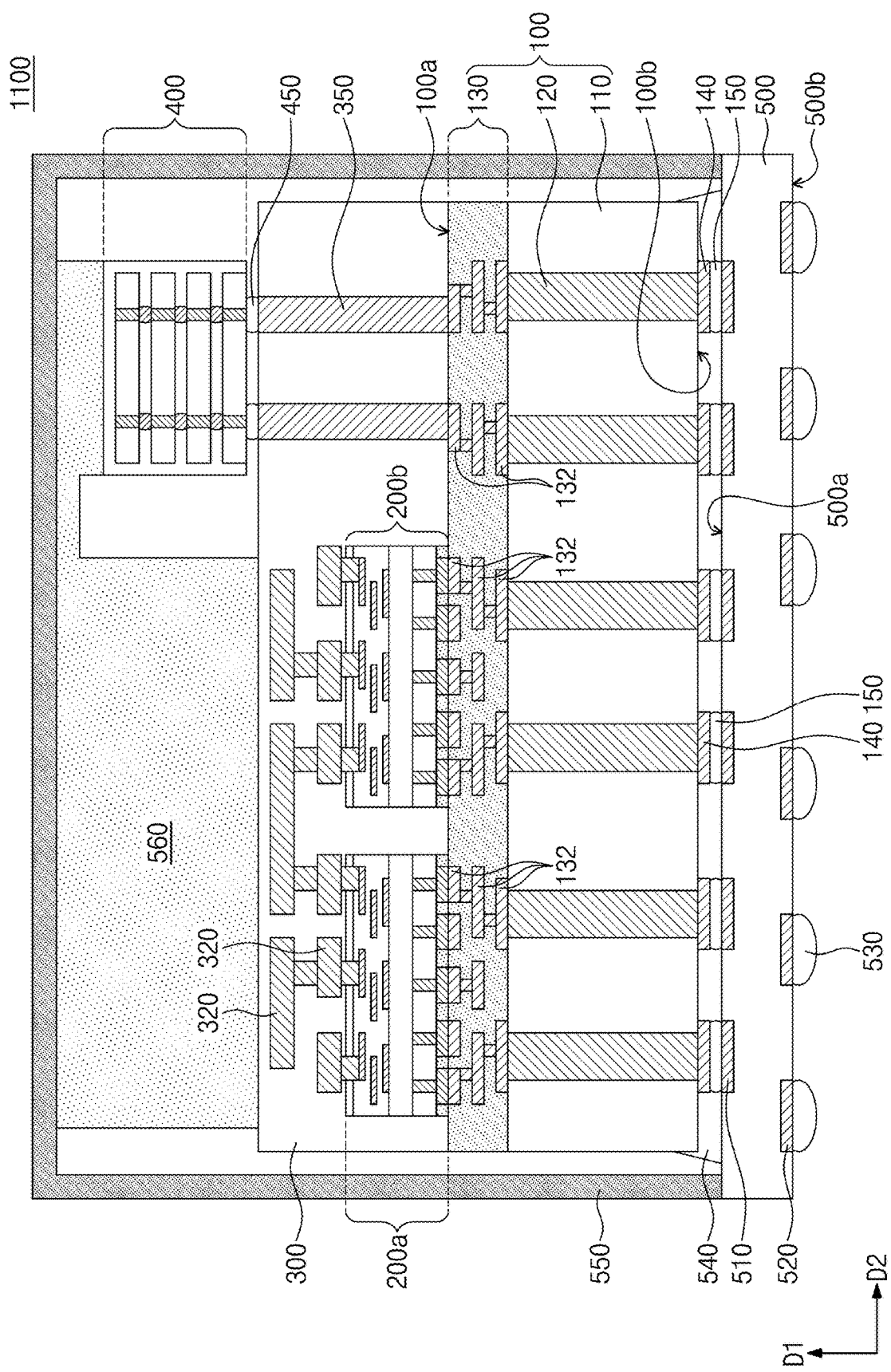
FIG. 11 illustrates a cross-sectional view showing a semiconductor package according to some embodiments of inventive concepts.

FIG. 11 illustrates a cross-sectional view showing a semiconductor package according to some embodiments of inventive concepts. The following semiconductor package is similar to the semiconductor package discussed with reference to FIGS. 1 and 2, and thus the major differences between the semiconductor packages will be described below in the interest of brevity of description.

Referring to FIG. 11, a semiconductor package 1100 may further include a lower substrate 500 and a thermal radiation structure 550 on the lower substrate 500. The components of the semiconductor package 1000 discussed with reference to FIGS. 1 and 2 may be disposed on the lower substrate 500 and within the thermal radiation structure 550.

The lower substrate 500 may include first substrate pads 510 adjacent to a first surface 500a of the lower substrate 500, and may also include second substrate pads 520 adjacent to a bottom surface 500b of the lower substrate 500. The first substrate pads 510 may be electrically connected to the second substrate pads 520 through internal wiring lines in the lower substrate 500. The first and second substrate pads 510 and 520 may include a conductive material. The lower substrate 500 may be provided on its bottom surface 500b with lower bumps 530 that are correspondingly connected to the second substrate pads 520. The lower bumps 530 may include a conductive material and may have at least one selected from solder-ball shapes, bump shapes, and pillar shapes. The lower substrate 500 may be, for example, a printed circuit board, a lower semiconductor chip, or a lower semiconductor package.

The interposer substrate 100 may be mounted on the top surface 500a of the lower substrate 500. The conductive pads 140 may be disposed on the first substrate pads 510 of the lower substrate 500, and the connection bumps 150 may be disposed between the conductive pads 140 and the first substrate pads 510. Each of the conductive pads 140 may be connected through a corresponding one of the connection bumps 150 to a corresponding one of the first substrate pads 510. The interposer substrate 100 may be electrically connected to the lower substrate 500 through the conductive pads 140, the connection bumps 150, and the first substrate pads 510.

A lower under-fill layer 540 may be disposed between the interposer substrate 100 and the lower substrate 500, and may cover the conductive pads 140 and the connection bumps 150. The lower under-fill layer 540 may include a dielectric polymer material, such as an epoxy resin.

The lower substrate 500 may be provided on its top surface 500a with the thermal radiation structure 550 that covers components of the semiconductor package 1000 discussed with reference to FIGS. 1 and 2. The thermal radiation structure 550 may include a thermal conductive material. The thermal conductive material may include a metallic material (e.g., copper and/or aluminum) or a carbon-containing material (e.g., graphene, graphite, and/or carbon nano-tube). For example, the thermal radiation structure 550 may include a single metal layer or a plurality of stacked metal layers. For another example, the thermal radiation structure 550 may include a heat sink or a heat pipe. For another example, the thermal radiation structure 550 may be configured to use water cooling.

The semiconductor package 1100 may further include a thermal conductive layer 560 interposed between the passivation layer 300 and the thermal radiation structure 550 and between the third semiconductor chip 400 and the thermal radiation structure 550. The thermal conductive layer 560 may include a thermal interface material (TIM). The thermal interface material may include, for example, a polymer and thermal conductive particles. The thermal conductive particles may be dispersed within the polymer. Heat generated from the plurality of semiconductor chips 200a, 200b, and 400 may be transferred through the thermal conductive layer 560 to the thermal radiation structure 550.

According to embodiments of inventive concepts, an interposer substrate may include a power delivery network (PDN) that provides power or ground to semiconductor chips mounted on the interposer substrate. A plurality of chip pads of the semiconductor chips may be directly bonded to corresponding ones of wiring patterns included in the interposer substrate, with the result that the semiconductor chips may be connected to the power delivery network (PDN). In addition, the semiconductor chips may be electrically connected to each other through redistribution patterns formed on (or above) the semiconductor chips.

As the chip pads are directly bonded to the corresponding wiring patterns of the interposer substrate, heat generated from the semiconductor chips may be easily discharged through the interposer substrate. Moreover, as the semiconductor chips are electrically connected to each other through the redistribution patterns on the semiconductor chips, mutual connection may be easily established between the semiconductor chips.

Accordingly, it may be possible to provide a semiconductor package in which mutual connection is easily established between a plurality of semiconductor chips and which exhibits improved thermal radiation properties.

While some embodiments of explaining inventive concepts have been described, inventive concepts are not limited to the embodiments described above. One of ordinary skill in the art would appreciate that variations in form and detail may be made therein without departing from the spirit and scope of inventive concepts as set forth in the claims.

What is claimed is:

1. A semiconductor package, comprising:
an interposer substrate having a first surface and a second surface that are opposite to each other, the interposer substrate including a wiring layer adjacent to the first surface and a plurality of through electrodes that penetrate the interposer substrate and connect to the wiring layer, each of the plurality of through electrodes extending from the wiring layer toward the second surface;
a semiconductor chip on the first surface of the interposer substrate;
a passivation layer on the first surface of the interposer substrate, the passivation layer covering the semiconductor chip; and
a plurality of redistribution patterns in the passivation layer and connected to the semiconductor chip,
wherein the semiconductor chip has a third surface and a fourth surface that are opposite to each other, the third surface of the semiconductor chip faces the first surface of the interposer substrate, and the plurality of redistribution patterns are connected to the fourth surface of the semiconductor chip,
wherein the semiconductor chip includes:
a plurality of chip pads adjacent to the third surface;
a semiconductor substrate on the plurality of chip pads;
a plurality of chip through electrodes penetrating the semiconductor substrate and spaced apart from each other in the semiconductor substrate;
a circuit layer on the semiconductor substrate; and
a chip wiring layer on the circuit layer and adjacent to the fourth surface,
wherein the plurality of chip through electrodes are connected to the plurality of chip pads,
wherein each of the plurality of chip pads is directly connected to a corresponding one of a plurality of wiring patterns in the wiring layer of the interposer substrate, and
wherein the plurality of redistribution patterns are connected to a plurality of chip wiring patterns in the chip wiring layer.

2. The semiconductor package of claim 1, wherein
the circuit layer is between the chip wiring layer and the plurality of chip through electrodes, and
wherein the plurality of chip through electrodes and the plurality of chip wiring patterns in the chip wiring layer are connected to the circuit layer.

3. The semiconductor package of claim 2, wherein the plurality of chip through electrodes are between the circuit layer and the plurality of chip pads.

4. The semiconductor package of claim 1, wherein
each of the plurality of redistribution patterns and the plurality of chip wiring patterns in the chip wiring layer has a thickness in a direction perpendicular to the first surface of the interposer substrate, and
wherein the thickness of each of the plurality of redistribution patterns is greater than the thickness of each of the plurality of chip wiring patterns.

5. The semiconductor package of claim 1, wherein
each of the plurality of redistribution patterns and the plurality of wiring patterns in the wiring layer of the interposer substrate has a thickness in a direction perpendicular to the first surface of the interposer substrate, and
wherein the thickness of each of the plurality of redistribution patterns is greater than the thickness of each of the plurality of wiring patterns.

6. The semiconductor package of claim 1, wherein a size of each of the plurality of through electrodes included in the interposer substrate is greater than a size of each of the plurality of chip through electrodes included in the semiconductor chip.

7. The semiconductor package of claim 1, wherein
the wiring layer of the interposer substrate includes a wiring dielectric layer that covers the plurality of wiring patterns, and
the semiconductor chip further includes a pad dielectric layer that covers the plurality of chip pads, and
wherein the pad dielectric layer is in direct contact with wiring dielectric layer in the wiring layer.

8. A semiconductor package, comprising:
an interposer substrate having a first surface and a second surface that are opposite to each other, the interposer substrate including a wiring layer adjacent to the first surface;
a first semiconductor chip and a second semiconductor chip that are horizontally spaced apart from each other on the first surface of the interposer substrate;
a passivation layer on the first surface of the interposer substrate, the passivation layer covering the first semiconductor chip and the second semiconductor chip; and
a plurality of redistribution patterns in the passivation layer, the plurality of redistribution patterns connecting the first semiconductor chip to the second semiconductor chip,
wherein the first semiconductor chip has a third surface and a fourth surface that are opposite to each other, the first semiconductor chip including:
a plurality of first chip pads adjacent to the third surface;
a first semiconductor substrate on the plurality of first chip pads;
a plurality of first chip through electrodes penetrating the first semiconductor substrate and spaced apart from each other in the first semiconductor substrate; and
a first circuit layer on the first semiconductor substrate,
wherein the second semiconductor chip has a fifth surface and a sixth surface that are opposite to each other, the second semiconductor chip including:
a plurality of second chip pads adjacent to the fifth surfaces;
a second semiconductor substrate on the plurality of second chip pads;
a plurality of second chip through electrodes penetrating the second semiconductor substrate and spaced apart from each other in the second semiconductor substrate; and
a second circuit layer on the second semiconductor substrate,
wherein each of the plurality of first chip pads and the plurality of second chip pads are directly connected to a corresponding one of a plurality of wiring patterns in the wiring layer of the interposer substrate, and wherein the plurality of redistribution patterns are connected to the fourth surface of the first semiconductor chip and to the sixth surface of the second semiconductor chip.

9. The semiconductor package of claim 8, wherein the interposer substrate further includes a plurality of through electrodes that penetrate the interposer substrate, and
wherein each of the plurality of through electrodes connects to the wiring layer and extends from the wiring layer toward the second surface.

10. The semiconductor package of claim 9, wherein
the first semiconductor chip further includes a first chip wiring layer adjacent to the fourth surface, the first circuit layer between the first chip wiring layer and the first semiconductor substrate, and
the second semiconductor chip further includes a second chip wiring layer adjacent to the sixth surface, the second circuit layer between the second chip wiring layer and the second semiconductor substrate.

11. The semiconductor package of claim 10, wherein the plurality of redistribution patterns are connected to a plurality of first chip wiring patterns in the first chip wiring layer of the first semiconductor chip and to a plurality of second chip wiring patterns in the second chip wiring layer of the second semiconductor chip.

12. The semiconductor package of claim 8, wherein
the plurality of first chip through electrodes are connected to the first circuit layer and the plurality of first chip pads, and
the plurality of second chip through electrodes are connected to the second circuit layer and the plurality of second chip pads.

13. The semiconductor package of claim 9, wherein a size of each of the plurality of through electrodes included in the interposer substrate is greater than a size of each of the plurality of first and the plurality of second chip through electrodes.

14. The semiconductor package of claim 8, wherein
each of the plurality of redistribution patterns and the plurality of wiring patterns in the wiring layer of the interposer substrate has a thickness in a direction perpendicular to the first surface of the interposer substrate, and
wherein the thickness of each of the plurality of redistribution patterns is greater than the thickness of each of the plurality of wiring patterns.

15. The semiconductor package of claim 8, wherein the first semiconductor chip and the second semiconductor chip are the same as each other.

16. A semiconductor package, comprising:
an interposer substrate having a first surface and a second surface that are opposite to each other, the interposer substrate including a wiring layer adjacent to the first surface;
a first semiconductor chip and a second semiconductor chip that are horizontally spaced apart from each other on the first surface of the interposer substrate;
a passivation layer on the first surface of the interposer substrate, the passivation layer covering the first semiconductor chip and the second semiconductor chip;
a third semiconductor chip on the passivation layer;
a plurality of conductive pillars below the third semiconductor chip; and
a plurality of redistribution patterns in the passivation layer, the plurality of redistribution patterns connecting the first semiconductor chip to the second semiconductor chip,
wherein the first semiconductor chip has a third surface and a fourth surface that are opposite to each other, the first semiconductor chip including a plurality of first chip pads adjacent to the third surface,
wherein the second semiconductor chip has a fifth surface and a sixth surface that are opposite to each other, the second semiconductor chip including a plurality of second chip pads adjacent to the fifth surface,
wherein each of the plurality of first chip pads and the plurality of second chip pads are directly bonded to a corresponding one of a plurality of wiring patterns in the wiring layer,
wherein the plurality of redistribution patterns are connected to the fourth surface of the first semiconductor chip and to the sixth surface of the second semiconductor chip,
wherein the plurality of conductive pillars penetrate through the passivation layer and connect with the wiring layer of the interposer substrate, and
wherein the plurality of conductive pillars are connected to corresponding ones of the plurality of wiring patterns in the wiring layer.

17. The semiconductor package of claim 16, wherein
the first semiconductor chip and the second semiconductor chip are the same as each other, and
the third semiconductor chip is different from the first semiconductor chip and the second semiconductor chip.

18. The semiconductor package of claim 16, wherein each of the first semiconductor chip, the second semiconductor chip, and the plurality of conductive pillars has a thickness in a direction perpendicular to the first surface of the interposer substrate, and
wherein the thickness of each of the plurality of conductive pillars is greater than the thickness of each of the first semiconductor chip and the second semiconductor chip.

* * * * *